United States Patent [19]

Mittag

[11] Patent Number: 5,398,865

[45] Date of Patent: Mar. 21, 1995

[54] PREPARATION OF SURFACES FOR SOLDER JOINING

[75] Inventor: Michael T. Mittag, New-Haven, Vt.

[73] Assignee: Electrovert Ltd., La Prairie, Canada

[21] Appl. No.: 65,273

[22] Filed: May 20, 1993

[51] Int. Cl.$^6$ .......................................... B23K 35/363
[52] U.S. Cl. .................................... 228/219; 228/223; 228/260
[58] Field of Search ............... 228/37, 219, 223, 260, 228/224; 148/23, 24

[56] References Cited

U.S. PATENT DOCUMENTS

| | | | |
|---|---|---|---|
| 4,106,958 | 8/1978 | Stayner | 148/23 |
| 4,504,007 | 3/1985 | Anderson et al. | 228/224 |
| 4,963,401 | 10/1990 | Kaspaul | 148/23 X |
| 5,045,128 | 9/1991 | Landreth et al. | 228/223 X |
| 5,090,651 | 2/1992 | Mittag | 228/219 |
| 5,104,494 | 4/1992 | Tench et al. | |
| 5,121,875 | 6/1992 | Hagerty et al. | 228/223 |
| 5,240,169 | 8/1993 | Gileta | 228/219 |

OTHER PUBLICATIONS

Frear et al., *Fluxless Soldering Using Actuated Acid Vapors*, pp. 1704–1715.
Bakszt M., *Providing Solderability Retention By Means of Chemical Inhibitors*, Printed Circuit World, pp. 2–8, Convention III.
*Dry Soldering Process Using Halogenated Gas*, IBM Technical Disclosure Bulletin, vol. 27, No. II, Apr. 1985, p. 6513.
Goldman et al., *Proprietary Treatments for Copper Pads*, PC FAB, Oct. 1990, pp. 60–66.

*Primary Examiner*—Kenneth J. Ramsey
*Attorney, Agent, or Firm*—Darby & Darby

[57] ABSTRACT

An apparatus and process prepares surfaces on components, boards and the like for assembly and solder joining. Oxides and other coatings can be removed from surfaces to be soldered without having to solder coat surfaces prior to joining. A polymer and an activator combination is applied to the surfaces, the polymer being thermally de-polymerizable and the combination removing oxides from the surfaces. The surfaces are heated after application of the polymer and activator to de-polymerize the polymer. Solder is then applied to solder join the surfaces.

34 Claims, 1 Drawing Sheet

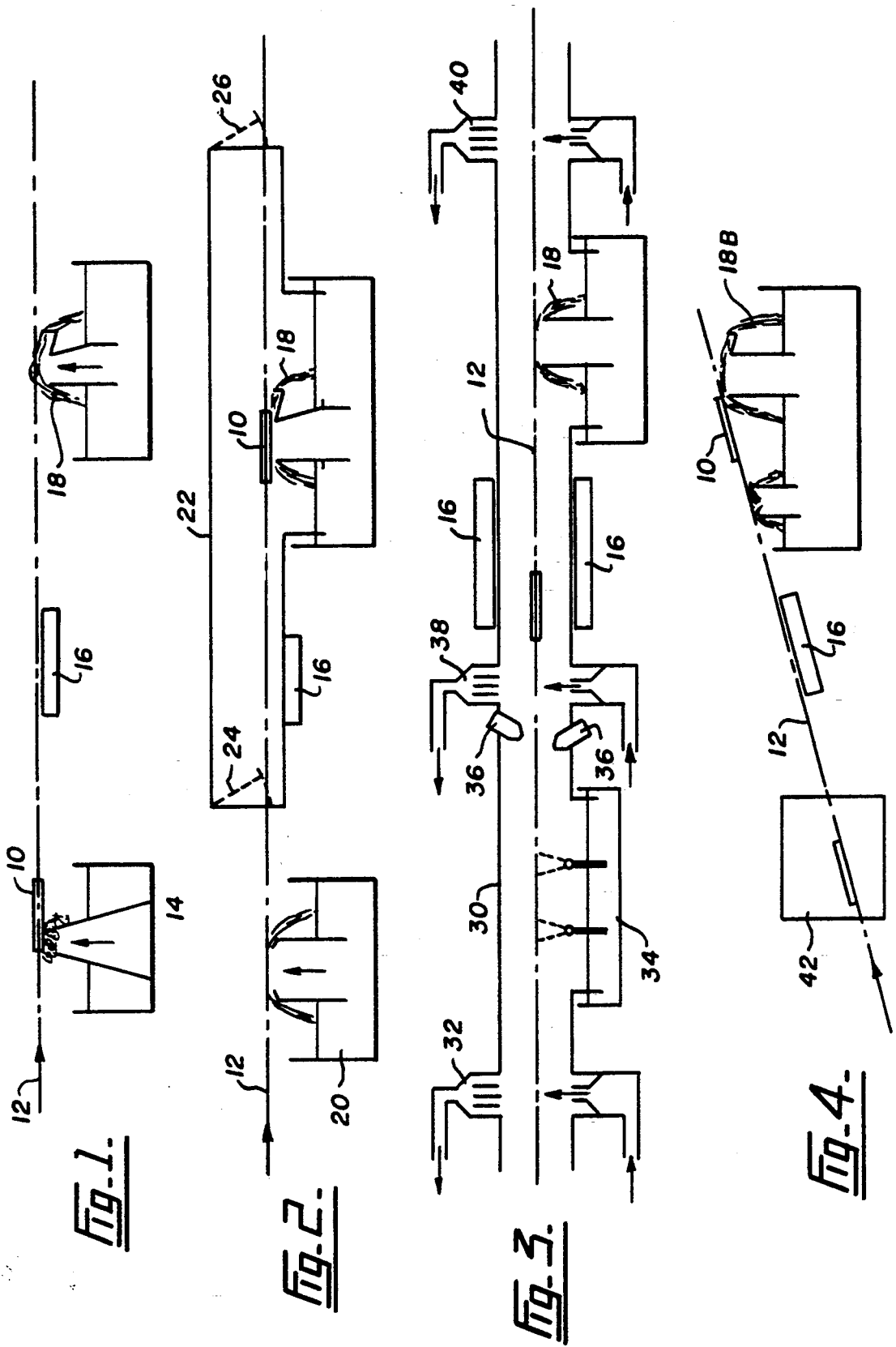

PREPARATION OF SURFACES FOR SOLDER JOINING

TECHNICAL FIELD

The present invention relates to solder joining and more specifically to preparing surfaces on components, boards and the like for assembly and solder joining.

BACKGROUND ART

In the manufacture of circuit boards and wiring boards it has been traditional to solder coat or solder wet surfaces on components, boards and the like before assembly. The reason for solder coating or, in some cases, tin or lead electroplating followed by fusing of surfaces, has been to preserve the solderability for long periods of time. Thus, when surfaces on components or boards have been solder coated, the coated surfaces are able to be solder joined without further treatment. Throughout the attached specification the term "element" has been used to mean circuit boards, wiring boards, or any components that have surfaces, holes, pins or the like that are to be solder joined.

Copper circuit boards or wiring boards are cheaper to produce than those that are solder coated, but they do not retain their solderability properties very long because the copper oxidizes rapidly after etching. (Etching is carried out to clean copper surfaces prior to soldering.) Protective coatings are sometimes applied to bare copper surfaces to preserve their solderability. These protective coatings are applied by dip coat or spray to exclude oxygen from the surfaces therefore retaining the solderability of the copper surfaces. Some protective coatings include a small amount of mild rosin flux, and during soldering, the alcohol component of the rosin flux dissolves the protective coating off the copper surfaces and permits the flux to activate the copper for good wave soldering results. When a water soluble flux is to be used for soldering, then rosin protective coatings on copper surfaces cannot be used because they are not compatible either with water soluble flux or with water cleaning after wave soldering. Commercial protective coatings have been formulated based on imidiazole and benzotriazole for use with water soluble flux. When a water soluble flux contacts the surface to be soldered on the circuit board, it penetrates these passivating protective materials based on imidiazole or benzotriazole on a copper surface and permits excellent wave soldering results.

Bare copper surfaces for fine-pitch surface mount components are preferred because of lower cost and flatness of the pads compared to other coatings. However, the protective coatings required for copper surfaces add additional costs to the preparation of surfaces for soldering and consequently to board fabrication. Normal fluxes that are applied to surfaces that have been coated either by oxides or protective coatings dissolve these coatings from the boards. However, flux residues and the removed oxides remain on these surfaces and are carried through a preheating stage prior to soldering. It has been found that some of the flux residues and removed oxides interfere with automatic pin testing and in some cases have to be removed by cleaning to prevent other problems occurring including corrosion of the solder connections.

Traditional surface coating treatments for preserving solderability of surfaces on circuit boards and the like generally still require the use of flux in order to properly prepare the surfaces of the leads and terminations of the components mounted in holes on the circuit boards or surface mount devices on the circuit surfaces prior to and during production wave soldering. The major ingredient of most traditional fluxes is alcohol and alcohol is the carrier which moves the activator part of the flux to coat the surfaces of boards and assist in removing metal surface oxides prior to wave soldering. Alcohols evaporate from the fluxer during production and also after being applied to the circuit board. Alcohol generally evaporates in a wave soldering machine during the preheating stage and these evaporated alcohols are called "volatile organic compounds" and must be exhausted from the machine out of the building. Volatile organic compounds are generally considered undesirable to the environment as they may lead to, or cause, pollution and/or global warming.

It has recently been suggested that oxides and coatings may be removed from circuit boards, component leads and terminations of components by electrochemical reduction treatment which eliminates the need for flux and specifically a flux containing alcohol. The electrochemical reduction treatment liquid removes the oxides and restores the solderability of the surfaces to be solder joined on the board and component leads.

DISCLOSURE OF INVENTION

It is an aim of the present invention to provide a process and apparatus for applying a liquid, powder or vapor to surfaces of a printed circuit board and components to be solder joined. It is a further aim of the present invention to be able to solder join elements without having to first solder coat surfaces to be solder joined. The liquid, powder or vapor applied to surfaces comprises a polymer combined with an activator such as an acid which, after being applied to the surfaces to be solder joined, is then heated in a preheater prior to soldering. The application of this polymer and activator acts like a flux and cleans the surfaces to be solder joined. The polymer de-polymerizes upon heating and forms gas which preferably is non-toxic and therefore does not affect the atmosphere. Also the material after polymerization does not leave any solid particles or deposits on the surfaces to be solder joined or on the insulating board laminate surfaces. Thus, one has the application of a polymer and activator combination which assists in cleaning the surfaces to be solder joined and then is dispersed upon heating without leaving any deposits which affect a soldered connection and without forming any volatile organic compounds which are considered undesirable.

The present invention provides a method of solder joining surfaces of elements comprising the steps of: applying a polymer and an activator combination to the surfaces of the elements to be solder joined, the polymer being thermally de-polymerizable and the combination removing oxides from the surfaces, heating the elements after application of the polymer and activator combination to de-polymerize the polymer and applying solder to solder join the surfaces.

The present invention also provides an apparatus for solder joining surfaces of elements comprising: an applicator means for applying a polymer and an activator combination to the surfaces of the elements to be solder joined, the polymer being thermally de-polymerizable and the polymer and activator combination able to remove oxides from the surfaces, a heater for heating the elements to a temperature sufficient for the polymer in the polymer and activator combination to de-polymerize, a soldering means to apply solder to the surfaces of the elements to be solder joined, and a conveyor means for conveying the elements to the applicator means, past the heater and to the soldering means.

BRIEF DESCRIPTION OF DRAWINGS

In drawings which illustrate embodiments of the present invention,

FIG. 1 is a schematic elevational view showing an applicator, preheater and a wave solder apparatus according to one embodiment of the present invention.

FIG. 2 is a schematic elevational view showing another embodiment of the present invention wherein the preheater and wave soldering device are enclosed within a tunnel.

FIG. 3 is a schematic elevational view showing a further embodiment of the present invention wherein the applicator, preheater and wave soldering device are all enclosed within a tunnel.

FIG. 4 is a schematic elevational view showing yet a further embodiment of the present invention wherein a path of travel for the conveyor is sloped upwards.

MODES FOR CARRYING OUT THE INVENTION

A polymer and activator combination is prepared for removing oxides from metal surfaces to be solder joined. One example of an activator is a suitable acid. The surfaces include circuit board pins, component surfaces, pads, leads, holes in circuit boards, and any surfaces at all which are to be solder joined. The surfaces do not require solder coating before being solder joined. The polymer and activator combination removes any oxidized coating or any pre-applied coating that may be on the surfaces. The polymer is thermally de-polymerizable and synthesizes into a gas phase when de-polymerization occurs. The polymer converts to simple materials. In one example these include carbon dioxide and water. These materials are natural in the atmosphere and consequently do not provide volatile organic compounds that are objectionable. The synthesized gas in one embodiment is similar or equivalent to a gaseous fluxing material. When the polymer depolymerizes, the materials react with the acid so that residue materials that are left on the surfaces after de-polymerization are benign and do not need be cleaned off the circuit boards for pin testing or for removal of corrosive residues.

The polymer is preferably a polycarbonate which depolymerizes in the range of 80° to 250° C. The acid component is preferably an organic acid and preferably an oxalic acid. In one embodiment a polycarbonate type polymer and oxalic acid are combined. The depolymerization occurs at a temperature in the range of approximately 150° to 170° C. This temperature range is compatible with heating circuit boards and the like prior to wave soldering.

In a preferred embodiment the application of the polymer and activator combination is done in an atmosphere which primarily excludes oxygen to avoid the surfaces re-oxidizing. It is also preferred that the preheating and wave soldering occur in an atmosphere which has reduced oxygen therein, to prevent reoxidization of the surfaces to be solder joined and reduce dross formation on the solder.

The application of the polymer and activator combination may be in a number of different forms. The combination itself may be in a liquid, powder or vapor form and the applicator may be by liquid or atomized spray, a liquid wave applicator, a foam generating applicator, a powder depositing applicator or a vapor depositing applicator.

FIG. 1 shows in one embodiment elements 10 moving on a conveyor 12 in a substantially horizontal path, passing over a foam generating applicator 14 followed by a heater 16 to a wave soldering device 18. FIG. 2 illustrates a wave type applicator 20 wherein the elements 10 are contacted with the polymer and acid combination liquid in a wave and then pass into a tunnel or enclosure 22 through an entrance door 24, past a heater 16 to a solder wave device 18, and out through an exit door 26. The tunnel 22 preferably contains nitrogen and excludes oxygen. The oxygen content in the nitrogen may vary from 100 ppm to 100,000 ppm. Nitrogen mixtures with higher impurity levels of oxygen are less costly to produce. The allowable degree of oxidation on the surfaces to be solder joined and the amount of oxidation and residue on the surfaces to be removed in order to ensure acceptable soldering results can be a factor in determining the oxygen impurity within the tunnel. Nitrogen may be supplied utilizing the membrane technology to provide cheaper production costs. The cost of supplying nitrogen is reduced if one can accept higher impurity levels.

FIG. 3 illustrates the conveyor 12 within a tunnel 30 passing first through an entry gas curtain 32 over a spray type applicator 34 past gas knives 36 to assist in blowing any liquid off the element 10, through an intermediate gas curtain 38 into a preheater zone with heaters 16 top and bottom to heat the elements 10. The elements then pass through a solder wave 18 and exit through an exit gas curtain 40.

It is preferred that the tunnel 30 have a reduced oxygen content therein and in another embodiment, the gas knives 36 utilize nitrogen or an equivalent inert gas to blow the polymer acid combination liquid off the elements prior to preheating. The purposes of the gas curtains 32, 38 and 40 are to separate the applicator area from the soldering area of the tunnel 30 and prevent atmospheric air entering the tunnel 30 at the entrance or at the exit.

FIG. 4 illustrates an upward sloping conveyor 12 wherein elements 10 pass through an applicator 42 for the application of the polymer and activator combination in either liquid, powder or vapor form, past a heater 16 and through two solder waves 18A and 18B.

The polymer and activator combination reacts to remove oxides from the surfaces to be solder joined immediately after application and during the depolymerization stage between the applicator and the solder wave. When the elements 10 reach the solder wave, the polymer has synthesized into a gas phase, and the gas has departed from the elements 10. Only benign residues are left on the surfaces to be solder joined and these do not need to be cleaned off the surfaces for pin testing, and are not residues that cause corrosion in a subsequent soldered connection.

By eliminating the cleaning of elements, and solder coating of elements, one avoids additional manufacturing steps and thus reduces production costs. Furthermore solvents which in the past have been used for cleaning surfaces prior to solder joining, are now eliminated and this avoids the problem of disposal of such solvents.

Various changes may be made to the embodiments shown without departing from the scope of the present invention which is limited only by the following claims.

The embodiments of the present invention in which an exclusive property or privilege is claimed are defined as follows:

1. A method of solder joining surfaces of elements comprising the steps of:
   applying a polymer and activator combination to the surfaces of the elements to be solder joined, the polymer being thermally de-polymerizable, the activator being oxalic acid, and the combination removing oxides from the surfaces;
   heating the elements after the application of the polymer and activator combination to de-polymerize the polymer; and
   applying solder to solder join the surfaces.

2. A method of solder joining surfaces of elements comprising the steps of:
   applying a polymer and activator combination to the surfaces of the elements to be solder joined, the polymer being a polycarbonate type polymer and de-polymerizing in a temperature range of about 150° to 170° C., the activator being an oxalic acid, and the combination removing oxides from the surfaces;
   heating the elements after the application of the polymer and activator combination to de-polymerize the polymer; and
   applying solder to solder join the surfaces.

3. The method of claim 2, wherein the polymer and activator combination is applied by an atomized spray.

4. A method of solder joining surface of elements comprising the steps of:
   applying a polymer and activator combination in one of a powder and vapor form to the surfaces of the elements to be solder joined, the polymer being thermally de-polymerizable and the combination removing oxides from the surfaces;
   heating the elements after the application of the polymer and activator combination to de-polymerize the polymer; and
   applying solder to solder join the surfaces.

5. The method of solder joining surfaces according to claim 1 wherein application of the polymer and activator combination, heating of the element, and application of solder occurs in an enclosure with a reduced oxygen content therein.

6. The method of solder joining surfaces according to claim 5 wherein the enclosure contains nitrogen.

7. The method of solder joining surfaces according to claim 6 wherein the nitrogen has an oxygen impurity in the range of 100 ppm to 100,00 ppm.

8. The method of solder joining surfaces according to claim 1 wherein heating of the element and application of solder occurs in an enclosure with a reduced oxygen content therein.

9. The method of solder joining surfaces according to claim 1 wherein the polymer and activator combination removes protective coatings on the surfaces to be solder joined.

10. The method of solder joining surfaces according to claim 1 wherein the solder is applied by a solder wave.

11. The method of solder joining surfaces according to claim 10 wherein the elements are conveyed in a horizontal path of travel.

12. The method of solder joining surfaces according to claim 10 wherein the elements are conveyed in an upward sloping path of travel.

13. The method of solder joining surfaces according to claim 1 wherein the polymer de-polymerizes into a gas phase.

14. The method of solder joining surfaces according to claim 13 wherein the gas phase includes carbon dioxide.

15. The method of solder joining surfaces according to claim 1 wherein the polymer de-polymerizes in a temperature range of about 80° to 250° C.

16. The method of solder joining surfaces according to claim 1 wherein the polymer and activator combination is applied in liquid form.

17. The method of solder joining surfaces according to claim 16 wherein the polymer and activator combination is applied by a liquid wave applicator.

18. The method of solder joining surfaces according to claim 16 wherein the polymer and activator combination is applied by a foam generating applicator.

19. The method of solder joining surfaces according to claim 2 wherein the solder is applied by a solder wave.

20. The method of solder joining surfaces according to claim 19 wherein the elements are conveyed in a horizontal path of travel.

21. The method of solder joining surfaces according to claim 19 wherein the elements are conveyed in an upward sloping path of travel.

22. The method of solder joining surfaces according to claim 2 wherein the polymer and activator combination is applied in liquid form.

23. The method of solder joining surfaces according to claim 2 wherein application of the polymer and activator combination, heating of the element, and application of solder occurs in an enclosure with a reduced oxygen content therein.

24. The method of solder joining surfaces according to claim 23 wherein the enclosure contains nitrogen.

25. The method of solder joining surfaces according to claim 24 wherein the nitrogen has an oxygen impurity in the range of 100 ppm to 100,00 ppm.

26. The method of solder joining surfaces according to claim 2 wherein heating of the element and application of solder occurs in an enclosure with a reduced oxygen content therein.

27. The method of solder joining surfaces according to claim 2 wherein the polymer and activator combination removes protective coatings on the surfaces to be solder joined.

28. The method of solder joining surfaces according to claim 4 wherein the activator is an acid.

29. The method of solder joining surfaces according to claim 4 wherein the acid in the polymer and activator combination is organic.

30. The method of solder joining surfaces according to claim 4 wherein the polymer de-polymerizes in a temperature range of about 80° to 250° C.

31. The method of solder joining surfaces according to claim 4 wherein application of the polymer and activator combination, heating of the element, and application of solder occurs in an enclosure with a reduced oxygen content therein.

32. The method of solder joining surfaces according to claim 31 wherein the enclosure contains nitrogen having an oxygen impurity in the range of 100 ppm to 100,00 ppm.

33. The method of solder joining surfaces according to claim 4 wherein heating of the element and application of solder occurs in an enclosure with a reduced oxygen content therein.

34. The method of solder joining surfaces according to claim 4 wherein the polymer and activator combination removes protective coatings on the surfaces to be solder joined.

* * * * *